United States Patent
Kay et al.

(10) Patent No.: US 10,833,658 B2
(45) Date of Patent: Nov. 10, 2020

(54) APPARATUSES AND METHODS USING CURRENT-STARVED RING OSCILLATOR BIASED BY FLOATING GATE TRANSISTORS WITH A VARIETY OF APPLICATIONS INCLUDING AS A POWER-FREE RADIATION DETECTOR OR SILICON AGE DETERMINATION OR ODOMETER SYSTEM

(71) Applicant: The United States of America, as represented by the Secretary of the Navy, Crane, IN (US)

(72) Inventors: Matthew J Kay, Jasper, IN (US); Adam Duncan, Bloomington, IN (US); Matthew Gadlage, Bloomington, IN (US); Austin H Roach, Bloomington, IN (US); Glenn Berger, Bloomington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 17 days.

(21) Appl. No.: 16/235,228

(22) Filed: Dec. 28, 2018

(65) Prior Publication Data
US 2019/0222202 A1    Jul. 18, 2019

Related U.S. Application Data

(60) Provisional application No. 62/612,284, filed on Dec. 29, 2017.

(51) Int. Cl.
*G01T 1/24* (2006.01)
*H03K 3/03* (2006.01)

(52) U.S. Cl.
CPC .......... *H03K 3/0315* (2013.01); *G01T 1/245* (2013.01); *G01T 1/246* (2013.01)

(58) Field of Classification Search
CPC ......... H03L 7/0995; H03L 7/099; H03L 5/00; H03L 1/00; H03B 5/1265; H03B 5/1228; G01T 1/245; H03K 3/03
See application file for complete search history.

(56) References Cited

U.S. PATENT DOCUMENTS 7,663,447 B2 * 2/2010 Matsuzaki .......... H01L 27/1214
331/186

* cited by examiner

*Primary Examiner* — Don K Wong
(74) *Attorney, Agent, or Firm* — Naval Surface Warfare Center, Crane Division; Eric VanWiltenburg

(57) ABSTRACT

Apparatuses and methods using current-starved ring oscillator biased by floating gate transistors with a variety of applications including as a power-free radiation detector or silicon age determination or odometer system.

3 Claims, 5 Drawing Sheets

APPARATUSES AND METHODS USING CURRENT-STARVED RING OSCILLATOR BIASED BY FLOATING GATE TRANSISTORS WITH A VARIETY OF APPLICATIONS INCLUDING AS A POWER-FREE RADIATION DETECTOR OR SILICON AGE DETERMINATION OR ODOMETER SYSTEM

CROSS-REFERENCE TO RELATED APPLICATIONS

The present application claims priority to U.S. Provisional Patent Application Ser. No. 62/612,284, filed Dec. 29, 2017, entitled "Apparatuses and Methods Using Current-Starved Ring Oscillator Biased by Floating Gate Transistors with a Variety of Applications Including as a Power-Free Radiation Detector or Silicon Age Determination or Odometer System," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,485) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention relates to systems and methods for using current-starved ring oscillator biased by floating gate transistors with a variety of applications including as a power-free radiation detector or silicon odometer.

A traditional ring oscillator operates by places an odd number of inverting circuits with the current stages output tied to the next stages input. The inverting circuits are commonly fabricated using CMOS inverters. A frequency measurement of the ring oscillator can be obtained by measuring the voltage on one of the input or output nodes. This measurement is typically obtained by first buffering the node to be measured as to not increase the load on the node being measured with respect to the other nodes in the circuit.

A traditional current starved ring oscillator operates similar to a ring oscillator with the addition of transistors in series with the transistors of each inverting stage. These additional transistors are biased by V P BIAS and V N_BIAS with the purpose of adding resistance between VDD and VSS to reduce the current flow and thus the switching speed.

Floating gate (FG) transistors have been used as charge storage elements in memory technologies such as Flash memory. Typically, a FG transistor in a flash memory circuit requires specialized manufacturing steps and is incompatible with conventional CMOS manufacturing processes. A modified FG cell compatible with CMOS manufacturing processes uses three standard CMOS PFET transistors to create a FG that is electrically isolated from all transistors. Charge can be applied to the FG in this cell by biasing the control gate (CG) and tunnel gates (TG) appropriately.

Various embodiments are provided including a method of creating a power-free radiation detector featuring a current starved ring oscillator biased by floating gate based cells. This circuit can be designed as a stand-alone circuit or integrated into an integrated circuit (IC). The power-free aspect allows the circuit to be irradiated while unbiased, and then exercised at a later time to determine if a radiation event had occurred. The ring oscillator output provides a simple readout that can be measured on-chip or with test and measurement equipment.

Applications using various embodiments of the invention can include an X-ray detector for anti-tamper applications to determine if an malicious actor has attempted to X-ray a part during a reverse engineering activity; a space radiation detector to act as a dosimeter to determine how much total ionizing dose (TID) the electronics on a spacecraft have received; and a silicon odometer to determine the age of a part since the oscillator frequency will decrease over time as charge bleeds off the floating gate. Various embodiments of the invention provide various benefits. For example, at least some embodiments enable a user to measure radiation or aging responses as a frequency for easy system level integration.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Various novel architectures and methods are provided that integrate CMOS based FG cells to bias the current limiting transistors in a current starved oscillator. Exemplary FG gate cells are provided that have a variable amount of leakage depending upon an oxide thicknesses of transistors sharing a common gate terminal. A number of transistors sharing the common gate terminal can also increase the leakage. Charge on the FG can be removed over time through leakage or by exposing the FG cell to ionizing radiation. Either case of charge removal from the FG, can be used to reduce source to gate voltage (VsG) of an exemplary transistor and thus increase the resistance which will lead to a decrease in measured oscillator frequency.

Figure 1A:
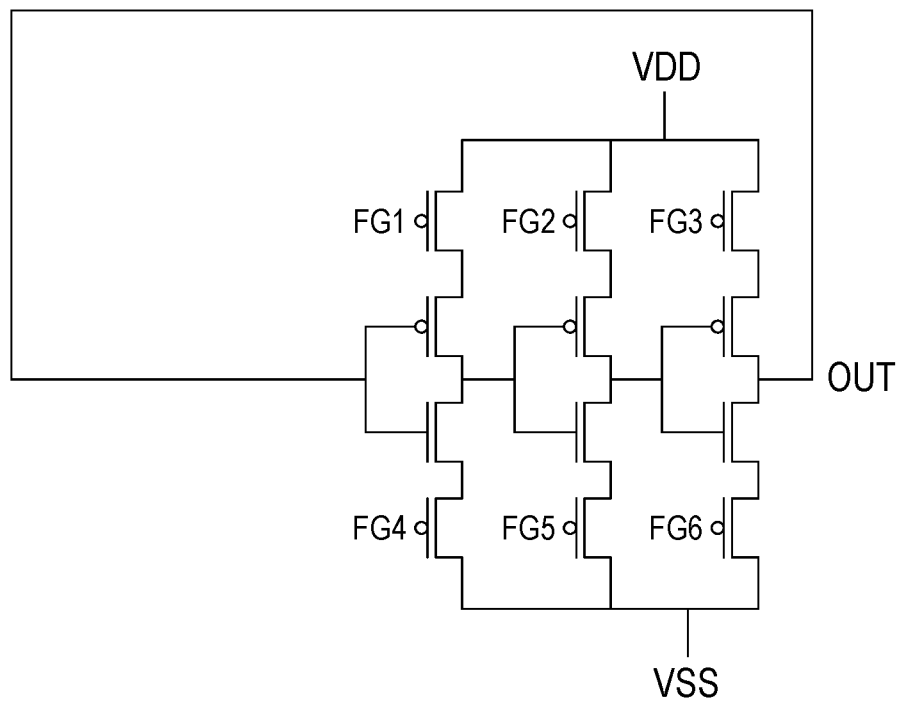
FIGS. 1A-1B show an embodiment that replaces each current limiting transistors in a current starved oscillator with a FG cell.
Figure 1B:
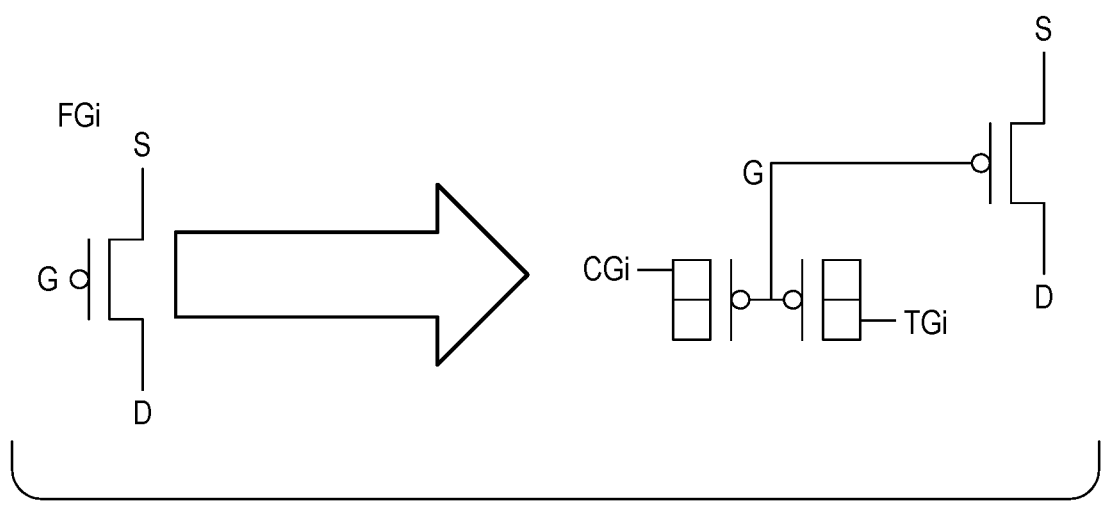

Referring to FIGS. 1A-1B, an embodiment is shown that replaces each of the current limiting transistors in a current starved oscillator with a FG cell. This implementation allows for lower leakage on each individual FG.

Figure 2:
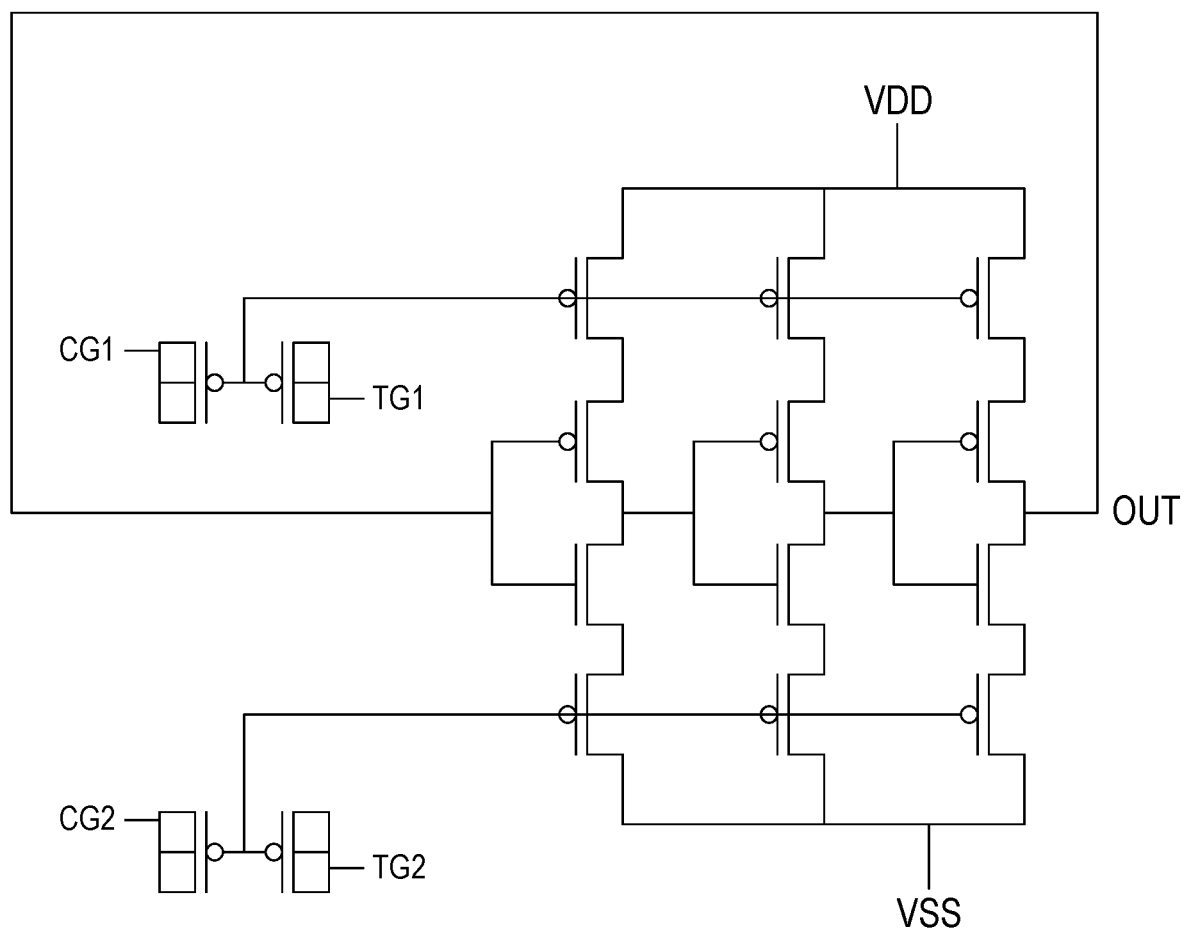
FIG. 2 shows an embodiment that includes one or more common FG biasing current limiting transistors.

Referring to FIG. 2, another embodiment is shown that uses a single FG to bias each of the current limiting transistors in a current starved oscillator with a FG cell. This implementation increases leakage of the FG cell.

Figure 3:
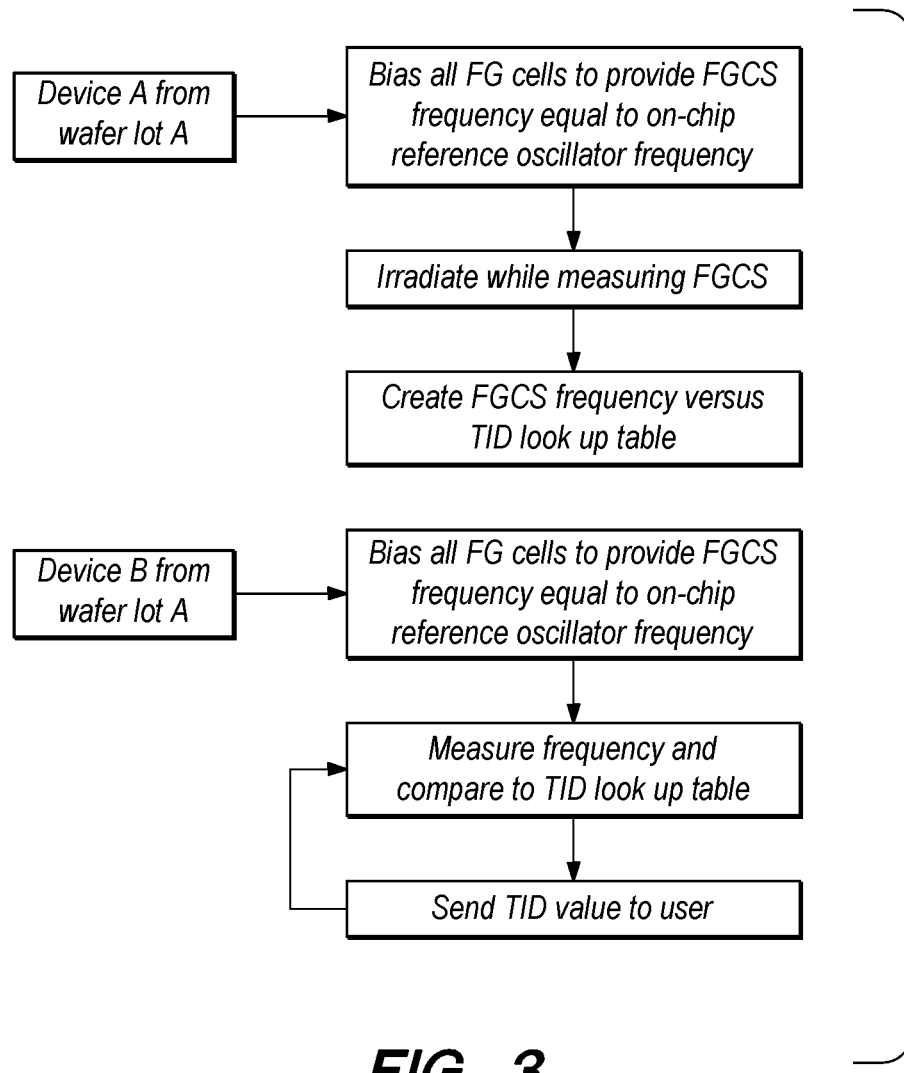
FIG. 3 shows an exemplary method for using an embodiment of the invention as a radiation detector using a raw frequency value look up table calibrated from radiation data obtained by a representative wafer lot sample device.

Referring to FIG. 3, an exemplary method is shown for using an embodiment of the invention as a radiation detector. In particular, an exemplary method for using an embodiment of the invention as a radiation detector is shown using a raw frequency value look up table calibrated from radiation data obtained by a representative wafer lot sample device. In this exemplary method, one device from a common wafer lot, Device A, is irradiated to obtain a look up table containing the floating gate current starved (FGCS) frequency vs TID data of the wafer lot. Subsequent devices from the wafer lot, such as device B, can then use the remaining section of the flow to read the FGCS frequency and use the lookup table to convert frequency degradation to accumulated TID.

Figure 4:
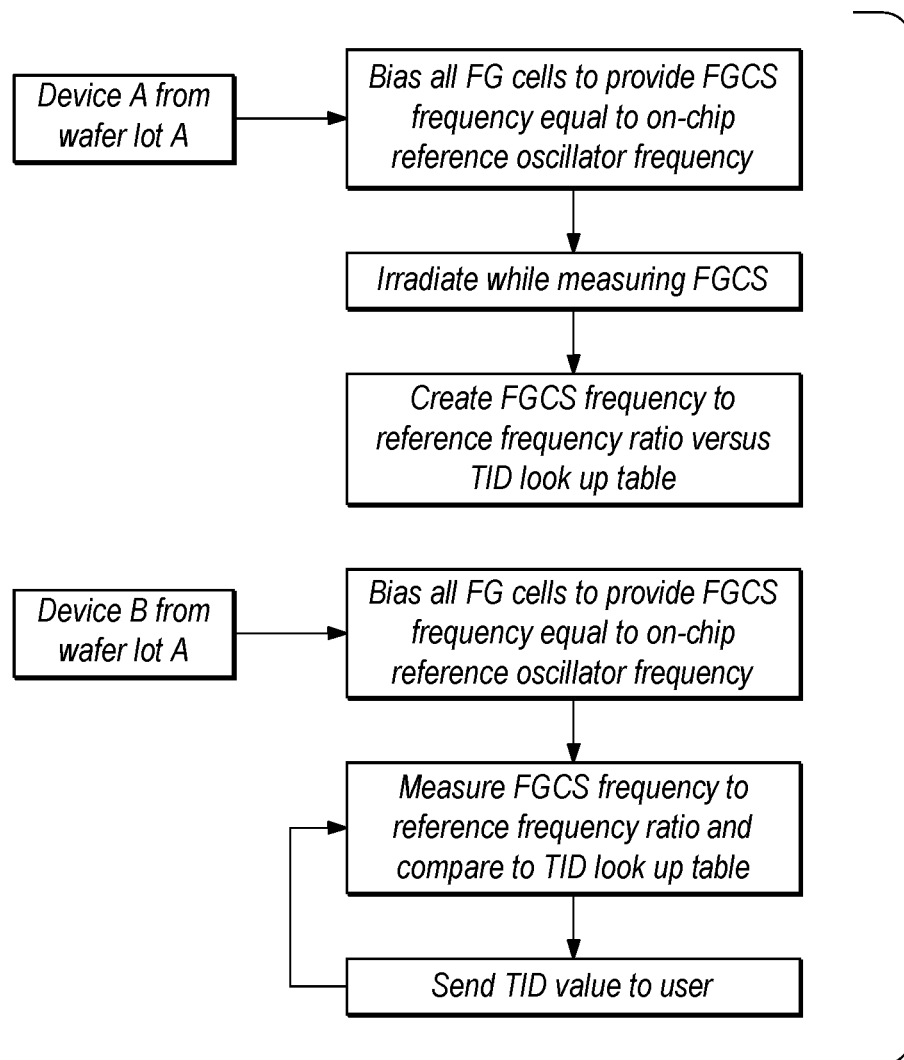
FIG. 4 shows an exemplar method for using an embodiment of the invention as a radiation detector using a frequency ratio look up table calibrated from radiation data obtained by a representative wafer lot sample device.

Referring to FIG. 4, another exemplary method is shown for using an embodiment of the invention as a radiation detector. In particular, FIG. 4 shows an exemplary embodiment used in an exemplary radiation detector method using a frequency ratio look up table calibrated from radiation data obtained by a representative wafer lot sample device. Similar to FIG. 3, this method uses a reference device from the wafer lot as a comparison, but includes a reference circuit in the comparison to help cancel out environmental effects like temperature and system effects such as supply voltage variations. The FGCS to reference frequency comparison can be calculated using a beat frequency circuit or by using two on-chip counters' clocked with a same reference clock. An exemplary generic schematic level representation of the comparison circuit is shown in FIG. 2.

Figure 5:
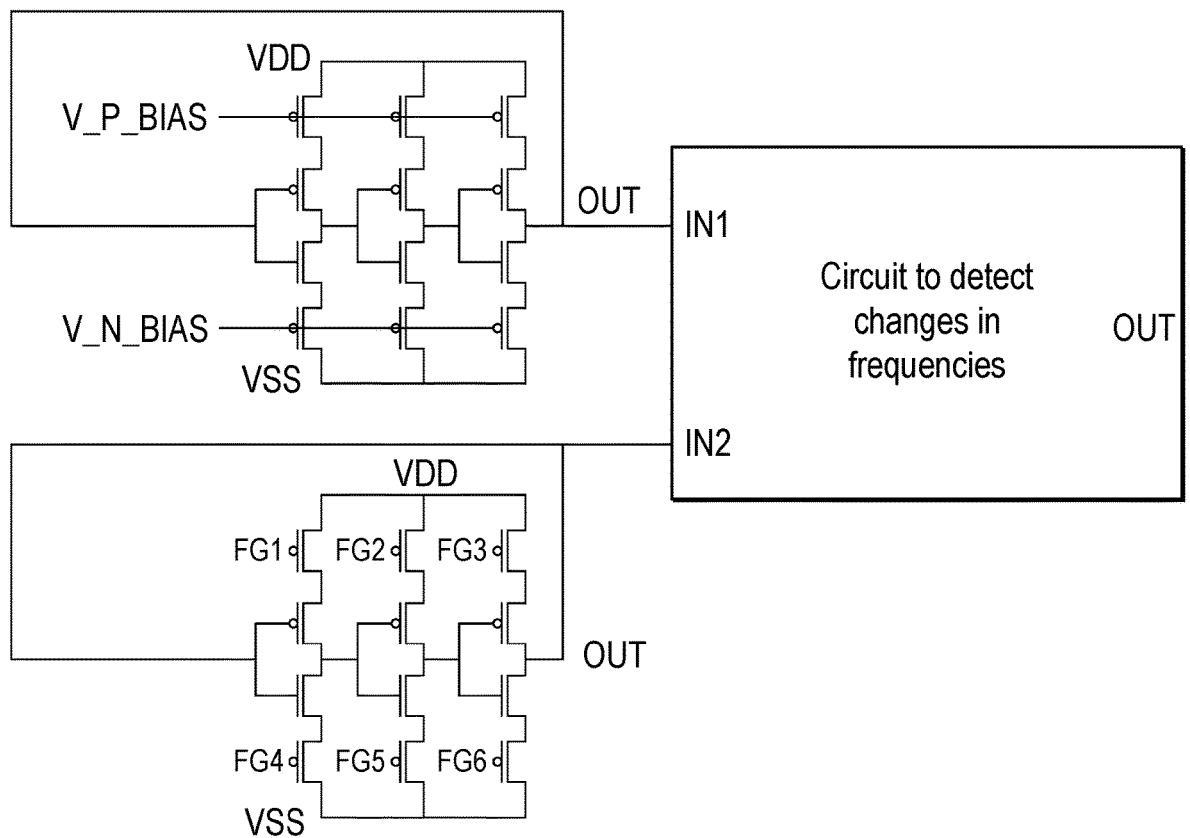
FIG. 5 shows an exemplary schematic representation of a circuit to compare the frequencies of an exemplary FGCS oscillator and a reference CS oscillator in accordance with one or more embodiments of the invention.

FIG. 5 shows a schematic representation of a circuit to compare the frequencies of the FGCS oscillator and a reference CS oscillator.

Exemplary methods shown in FIGS. 3-4 can be adjusted to measure frequency changes to due charge loss on the FG caused by aging as well in order to create a silicon odometer to determine approximate circuit age for supply chain tracking purposes. A rate of time-based charge leakage can be adjusted to increase by using thinner gate oxides or by increasing the number of transistors sharing the same FG as shown in FIG. 2.

Although the invention has been described in detail with reference to certain preferred embodiments, variations and modifications exist within the spirit and scope of the invention as described and defined in the following claims.

The invention claimed is:

1. A method of detecting radiation comprising:
providing a first device from a plurality of devices in a common wafer lot comprising a radiation detector system comprising a current-starved ring oscillator biased by floating gate transistors
irradiating the first device and generating measurement data comprising measured floating gate current starved (FGCS) frequency vs TID data of first device to create a lookup table containing the measurement data; and
reading FGCS frequency in other said plurality of devices in the common wafer lot and using the lookup table to convert frequency degradation to accumulated total ionizing dose.

2. A method of detecting radiation comprising:
providing a first device from a plurality of devices in a common wafer lot comprising a radiation detector system comprising a current-starved ring oscillator biased by floating gate transistors, wherein the plurality of devices further comprises a second device provided as a reference device that comprises a reference circuit;
irradiating the first device and generating measurement data comprising measured floating gate current starved (FGCS) frequency vs TID data of the first device to create a lookup table containing the measurement data; and
reading FGCS frequency in at least the second device and using the lookup table to convert frequency degradation to accumulated total ionizing dose, wherein the FGCS to reference frequency comparison is calculated using a beat frequency circuit or by using two on-chip counters' clocked with a same reference clock, wherein the comparison to help cancel out environmental effects like temperature and system effects such as supply voltage variations.

3. A method of detecting aging of an electrical circuit that includes a silicon structure comprising:
providing an electrical circuit age detection system comprising a current-starved ring oscillator biased by floating gate transistors;
disposing the electrical circuit age detection system in an environment; and
determining age of at least one section of an electrical circuit that includes a silicon structure using the electrical circuit age detection system.

* * * * *